(12) United States Patent
Tikhonski et al.

(10) Patent No.: US 7,176,877 B2
(45) Date of Patent: Feb. 13, 2007

(54) HIGH VOLTAGE PULSE DRIVER WITH CAPACITIVE COUPLING

(75) Inventors: Alexei Tikhonski, Cedar Park, TX (US); Thomas A. Visel, Austin, TX (US)

(73) Assignee: Nano-Proprietary, Inc., Austin, TX (US)

( * ) Notice: Subject to any disclaimer, the term of this patent is extended or adjusted under 35 U.S.C. 154(b) by 307 days.

(21) Appl. No.: 10/956,598

(22) Filed: Oct. 1, 2004

(65) Prior Publication Data

US 2005/0078103 A1    Apr. 14, 2005

Related U.S. Application Data

(60) Provisional application No. 60/510,284, filed on Oct. 10, 2003.

(51) Int. Cl.
G09G 3/36    (2006.01)
G09G 3/20    (2006.01)
G09G 5/00    (2006.01)
G09G 3/28    (2006.01)

(52) U.S. Cl. .............. 345/100; 345/75.2; 345/204; 345/60; 345/98

(58) Field of Classification Search ............... 345/98, 345/100, 60–68, 75.2, 204, 74.1, 75.1
See application file for complete search history.

(56) References Cited

U.S. PATENT DOCUMENTS

| | | | | |
|---|---|---|---|---|
| 2,989,703 A * | 6/1961 | Siegel | ............... | 327/205 |
| 3,628,061 A * | 12/1971 | Jackman | ............... | 327/310 |
| 4,575,720 A * | 3/1986 | Smith | ............... | 340/10.41 |
| 5,220,254 A * | 6/1993 | Waehner | ............... | 315/403 |

* cited by examiner

Primary Examiner—Richard Hjerpe
Assistant Examiner—Kevin M. Nguyen
(74) Attorney, Agent, or Firm—Fish & Richardson, P.C.; Kelly K. Kordzik

(57) ABSTRACT

A high voltage driver with capacitive coupling that is useful in the presence of the high power supply ripple common with higher-voltage systems. It permits extreme ranges of duty cycle, but without the limitations of transformer magnetics, or the increased complexity of optical coupling methods. It is also robust in the presence of voltage transients created by high-voltage arcing to the output driveline.

14 Claims, 8 Drawing Sheets

Positive Drive Implementation of Invention

**Prior Art – A Direct-Coupled Driver

**Prior Art – A Capacitively-Coupled Driver

**Prior Art, Ripple and Noise

**Prior Art – A Constant Current Source Driver

**Prior Art – A Transformer-Coupled Driver

**Negative Drive Version

HIGH VOLTAGE PULSE DRIVER WITH CAPACITIVE COUPLING

CROSS-REFERENCE TO RELATED APPLICATIONS

The present application claims priority to U.S. Provisional Application Ser. No. 60/510,284 filed Oct. 10, 2003.

TECHNICAL FIELD

The present invention relates in general to driver circuits, and in particular, to driver circuits for display applications.

BACKGROUND INFORMATION

It is convenient to use complementary N- and P-channel power FET transistors to form pulse drivers for high capacitance lines, as shown in the prior art of FIGS. 2, 3, 5, and 6. Such drivers find application as line drivers for large-screen cold cathode and plasma displays, for example.

An example of prior art is illustrated in FIG. 2, in which the output 56 is a function of the gap between the supply voltage 57 and ground. Zener diode 53 bridges the voltage difference between supply 57 and ground, and is selected to give reliable turn-on voltage to transistors 54 or 55. In this example, the zener voltage of 53 might be chosen to be the supply voltage 57 less the turn-on voltage of 54, or about 10 Volts.

Several problems with this prior art occur as the design requires use of higher voltage at output 56. The first is that as voltage 57 varies, intentionally by design, the value of zener diode 53 must be adjusted to compensate.

To alleviate this, a prior art circuit illustrated in FIG. 3, replaces zener diode 53 with a capacitor, permitting an arbitrary selection of supply voltage 57 without the limitations of a fixed-voltage gap-spanning device such as a zener diode 53.

A positive input pulse 41 drives the gate of transistor 42, bridging the power supply 46 voltage gap via capacitor 44 to turn transistor 43 off. That is, the gates of transistors 42 and 43 follow each other exactly because of the coupling capacitor 44, although they may be, for example, 400 volts apart. If there is perhaps 2 to 5 volts of noise on power rail 48, transistor 43 will improperly be turned on.

A second issue with simple capacitive coupling is that long Input pulses at input 41 are differentiated through the R-C time constant of resistor 45 and capacitor 44, causing eventual loss of drive signal at transistor 43. The impact of this is a limitation on the duty cycle (on/off ratio) obtainable with capacitive coupling. This problem is corrected by the Schmidt Trigger memory characteristics of the present invention.

A third problem in capacitive coupling is the impact of noise. While capacitive coupling tends towards a low-cost solution to other problems, it behaves erratically when higher voltage operation is contemplated. Region A shown in FIG. 4 shows an example desired supply voltage 57, a clean unchanging value.

Section B shows AC ripple that might be found on a typical power source, and Section C shows some additional noise that might also be present on such a source. A realistic power source typically guarantees that ripple and noise will not exceed 5% or 10% of the desired supply voltage, of 250 Volts, in this case.

Presumably, a clean input signal is supplied at input 41 and is properly transferred to the gate of transistor 43, again without noise. The source of transistor 43 that is connected to rail 48 is wandering, following the noise on that rail. Whenever the noise exceeds the turn-on parameter for transistor 43, that transistor turns on. In fact, the noise on that rail is commonly 5% to 10% of the supply voltage, ensuring that this driver will not properly work at voltages much higher than 40 volts or so. The present invention circumvents this problem when operating at higher voltages.

That is, the undesired signals riding on the supply line 57 might be as much as 12 to 25 volts. This is well in excess of the voltage needed to turn transistors 54 or 43 on (or off), causing unreliable operation of the drivers at higher voltages. As the supply voltage increases, noise eventually exceeds the turn-on voltage for the FET transistors, causing this erratic operation with simple capacitive coupling. Where current sources are used to bridge the rail-to-rail voltage difference, increased supply voltage directly increases power dissipation.

FIG. 5 illustrates another example of prior art, the replacement of zener diode 53 with a circuit of current sources 20–23. These current sources 20–23 span the high voltage gap between the upper 33 and lower 34 supply rails, as supplied by battery 30. Field Effect Transistors (FET) 26 and 27 form a complementary pair whose gates are separated by approximately the full supply voltage of voltage source 30. Constant current sources 20 and 21 may be replaced by fixed resistors. The input pulse 25 is applied to FETs 26 and 29, and it is inverse to FET 28, bringing output 31 low. The resultant change in currents from sources 22 and 23 is sensed by comparator 24, which shuts off the upper FET 27. In similar manner, reversing pulse 25 reverses the balance of sources 22 and 23, and reverses the conductions through FETs 26 and 27.

The voltage dropped across sources 22 and 23 would be approximately the rail-rail drop supplied by battery 30. The power dissipated in those sources would be the product of their current and that voltage, an increasingly large dissipation as the voltage source 30 increases. When only a few such constant current switching circuits can be designed to withstand the required dissipation, the matter quickly becomes unwieldy when scores or hundreds of such circuits are required, such as in a high-voltage plasma or carbon nanotube display, or in driving other forms of relatively high capacitance loads. The sum of the I*V products makes the approach impractical.

Yet another example of prior art is given below in FIG. 6, a transformer-coupled driver. This overcomes most of the noise-related limitations of capacitive coupling, but brings with it several other limitations. An Input signal 61 is amplified by 62 and applied to the gates of transistors 65 and 66. In this simplified schematic, a positive pulse 61 will turn transistor 65 on and transistor 66 off, or visa versa, leading to an Output pulse 68 whose magnitude is that of power rail 67. The rail 67 voltage, 250 Volts, for example, is spanned by the isolated secondary windings of transformers 63 and 64, eliminating much of the noise problem of the circuit illustrated in FIG. 3. This is because the secondary windings isolate the gate drive signals for transistors 65 and 66 from the common-mode noise of the power rail 67.

The transformer solution has two problems: the transformers are relatively costly, and the pulse width and duty cycles are limited by the characteristics of the transformer magnetics. The pulse width of Input 61 is limited by the R-C time constant of the capacitively-coupled circuit of FIG. 3, and by the coercivity of the iron in the transformers of FIG. 6. The present invention resolves these problems.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The present invention overcomes design problems of the prior art, such as current dissipation or noise-related erratic operation at higher voltages and limitations on duty cycle of the pulses created by the driver. A Schmidt Trigger with hysteresis also provides both pulse memory as well as considerable isolation from power supply noise, which are additional problems in the prior art.

Figure 1:
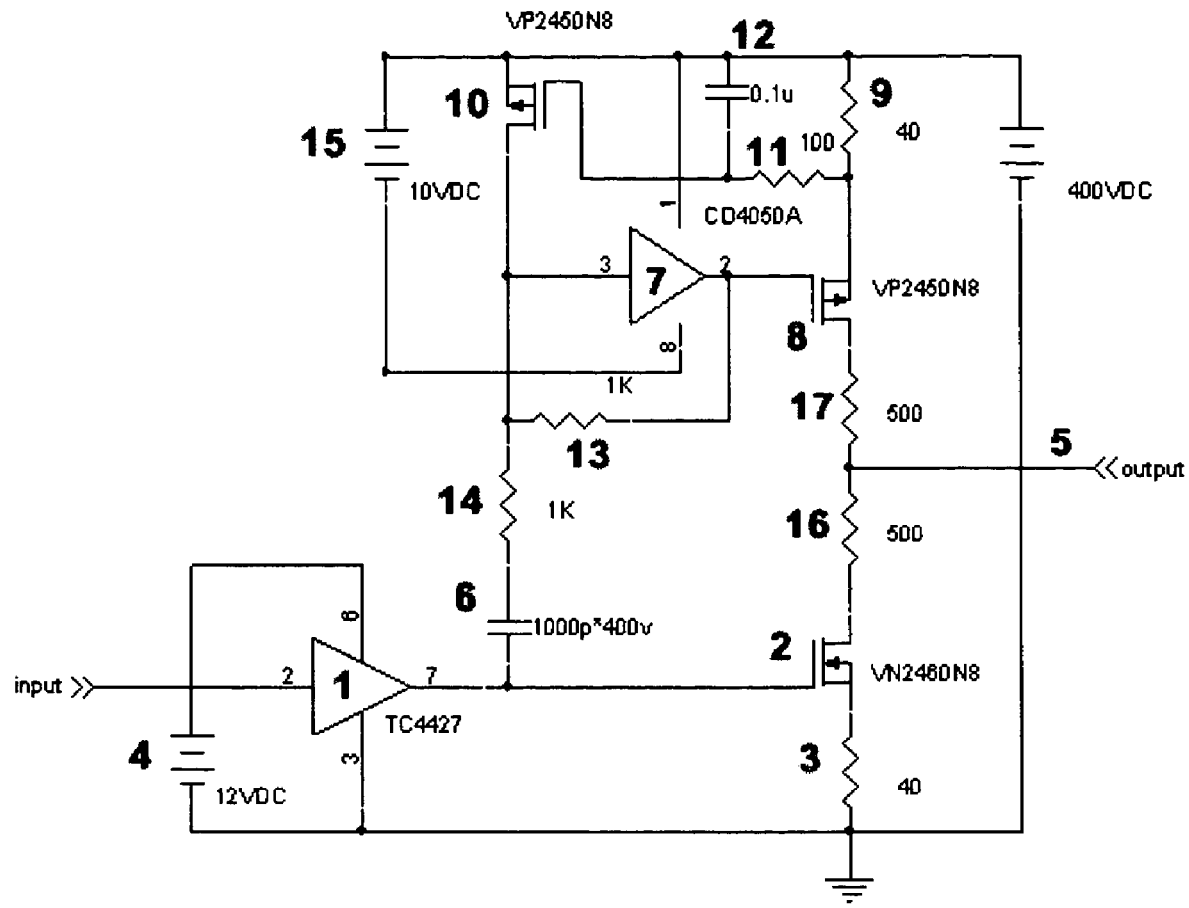
FIG. 1 illustrates a positive drive embodiment of the present invention.
Figure 2:
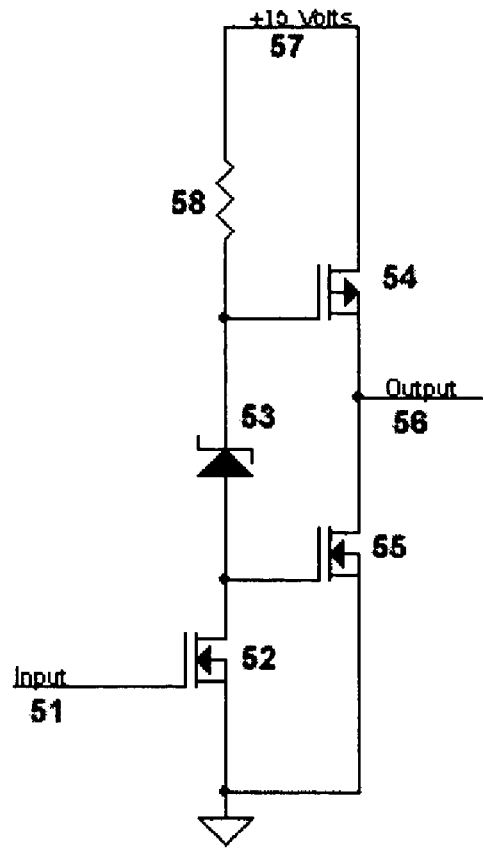
FIGS. 2–6 illustrate prior art drivers.
Figure 3:
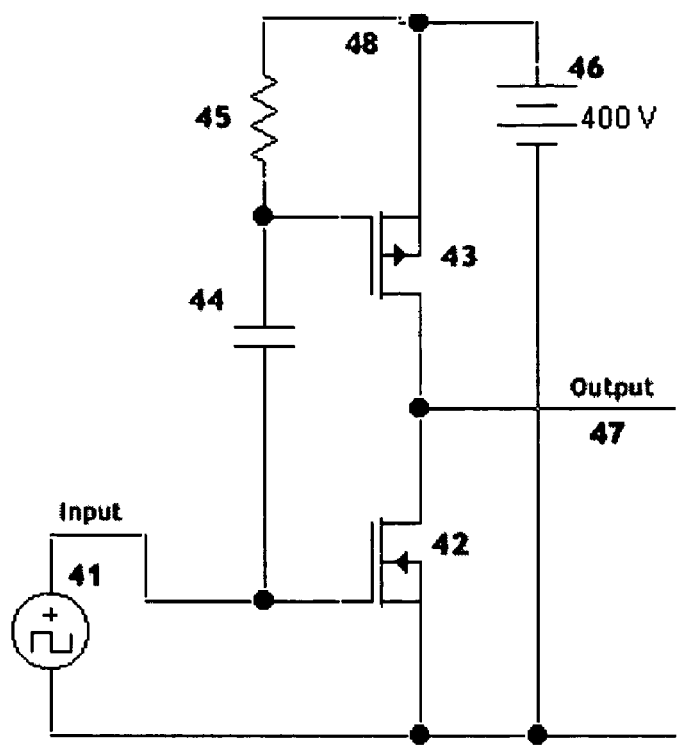

An example implementation of a positive-polarity driver using an embodiment of the invention is illustrated in FIG. 1.

Features of the Invention:
1. Variations are possible for both positive and negative drive systems
2. No coupling transformer is required, with the duty-cycle limitations inherent in the magnetics.
3. Simple capacitive coupling can be used across the high voltage gate-to-gate gap. The invention permits wider levels of high-frequency ripple on the high voltage supply lines and is insensitive to low-frequency (e.g., 120 Hz) ripple on those lines.
4. Current limitation is provided on both the high-side and low-side drives.
5. Constant power dissipation does not occur, as in a constant-current high voltage gap drive.
6. Short-circuit protection is supplied for the 'remote' high-voltage drive side.
7. Built-in FET back-diode protection protects against arc-induced positive spikes.
8. Current limit and active shut-down protects against arc-induced negative spikes.
9. Only minimal power dissipation occurs except during actual signal-edge data transitions.

Advantages of the Invention: This invention has many advantages over prior art methods such as transformer, optical and simple capacitor coupling.

For pulsed applications, the prior art commonly uses either direct (DC) or capacitive (AC) coupling between the upper and lower transistor gates, but this becomes impractical as the power supply voltage is increased. Ripple and transient noise on the supply line is typically 5% to 10% of the DC level, causing false triggering in both the direct and conventional capacitive coupling cases. To overcome this, the prior art often turns to use of transformers or to electro-optic means, effectively eliminating this common mode noise. These approaches work, but are often less desirable because of increased complexity, or the duty-cycle limitations imposed, especially by the magnetics.

Some of the advantages of the invention are given here, but this list by no means limits the advantages obtained over prior art methods:

1. A novel variant of capacitive coupling provides for wide power supply voltage ranges, but without the methods traditional sensitivity to noise.
2. The coupling capacitor sees low impedance on either side of it, further minimizing unwanted noise coupling.
3. Short-circuit protection is provided on the remote high-voltage side, and both sides are effectively protected from short term surges such as from arcs and shorts.
4. The circuit is insensitive to low frequency (60–100 Hz) supply-line ripple, as well as to moderately high frequency ripple components.
5. Although AC coupling is used, remote-side memory allows use of extremely long pulse widths, as well as an extreme range of duty cycle in the driving signal.
6. Circuit is capable of driving moderately large-capacitance loads with very large voltage swings.
7. Internal current limit circuit, with delay, provides short-circuit protection from thermal overload.

The invention described herein teaches a means of capacitive coupling that is useful in the presence of the high power supply ripple common with higher-voltage systems. It permits extreme ranges of duty cycle, but without the limitations of transformer magnetics, or the increased complexity of optical coupling methods. It is also robust in the presence of voltage transients created by high-voltage arcing to the output drive-line.

Figure 7:
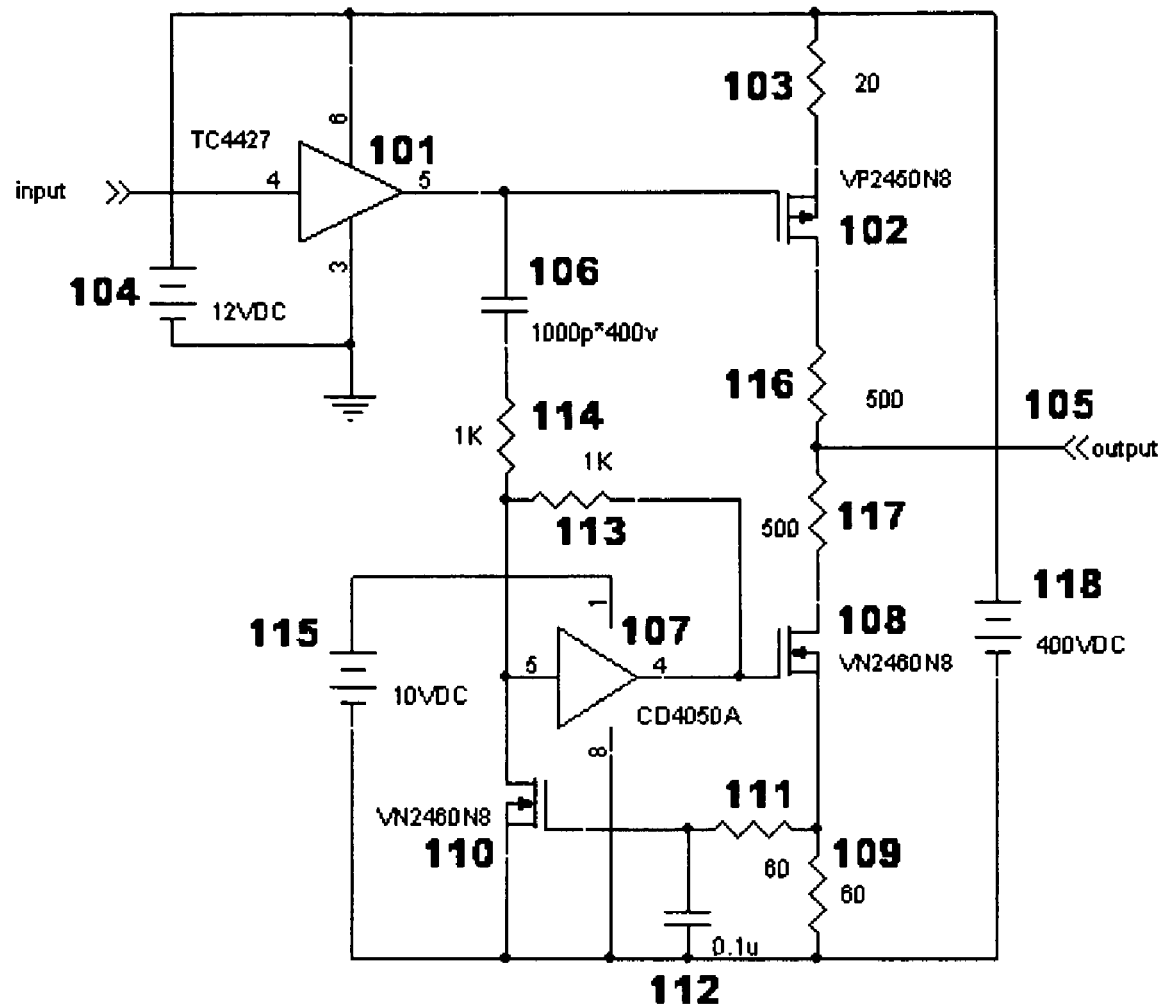
FIG. 7 illustrates a negative drive embodiment of the present invention.

A negative-going high voltage line driver is illustrated in FIG. 7 as one embodiment of the present invention. An (inverted) input pulse is applied to driver 101 and is boosted from low-voltage CMOS levels to a 12-volt swing at 101's output. That output is applied to the gate of transistor 102, turning it on. Simultaneously, the same 12-volt pulse is applied through a high-voltage capacitor 106 to the input of Schmidt Trigger 107. The output of 107 is applied to the gate of transistor 108, turning it off, with the result that output 105 goes high.

Similarly, when the input on driver 101 goes high, all above-stated signals reverse themselves, driving output 105 low. The noise margins provided by this invention are determined by the resistor pair 113–114 and the positive- and negative-going transition thresholds of Schmidt Trigger 107. The two resistors 113–114 are calculated to bring the input of Schmidt Trigger 107 above and/or below its switching threshold. The positive feedback through resistor 113 forces an additional hysterisis action that widens the margin beyond the normal difference in thresholds for positive and negative transitions of the input, which may typically be at about ⅓ and ⅔ of the supply voltage.

The driver 101 must supply enough signal to overcome the composite hysterisis of the Schmidt Trigger 107. For example, the supply for driver 101 of 12 volts generates a 12-volt drive, while the supply of Schmidt Trigger 107 establishes the switch-points for Schmidt Trigger 107.

Figure 4:
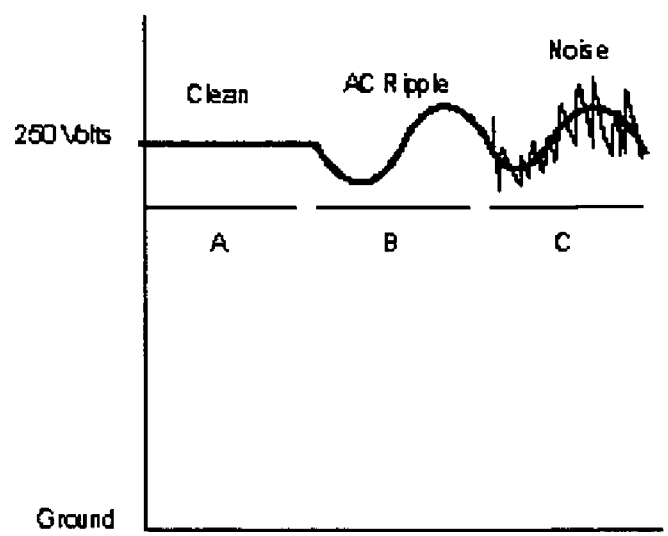
Figure 5:
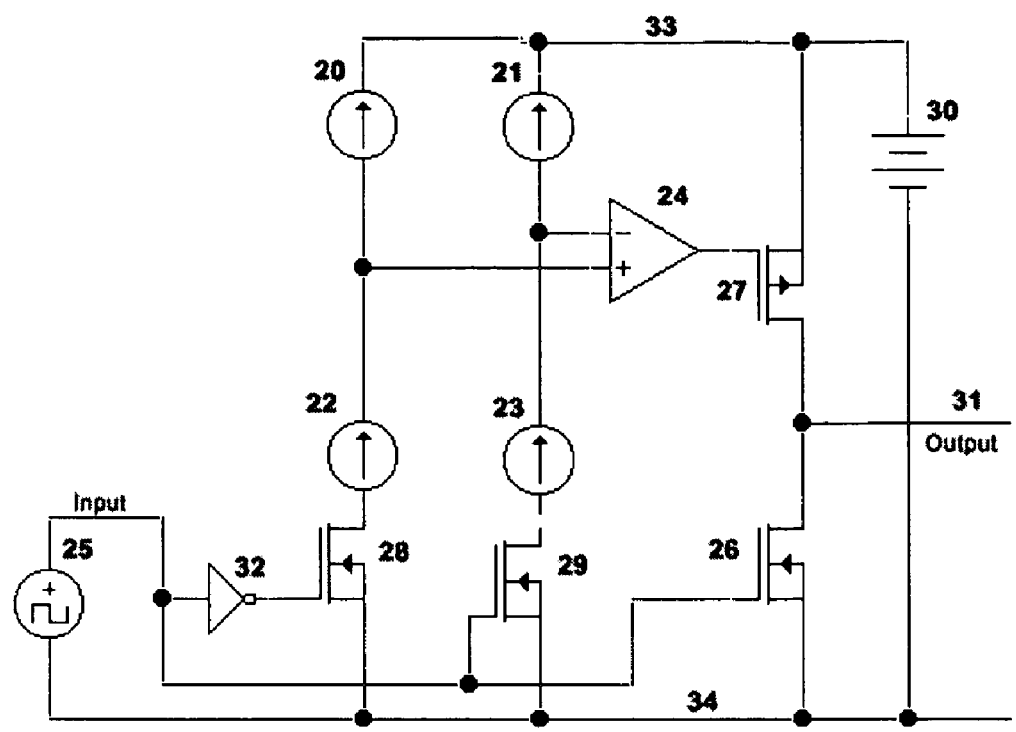
Figure 6:
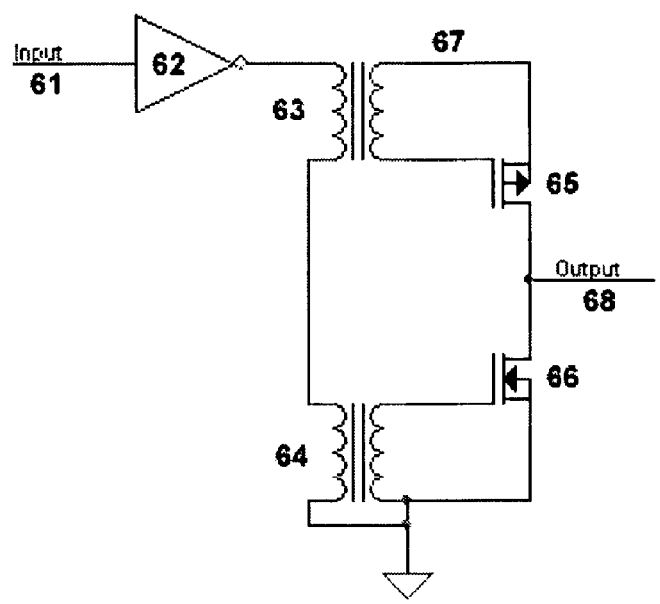

Use of a small time constant for the 106/113/114 R-C combination is acceptable, even for very long pulse widths. It drastically reduces the sensitivity for the lower half of the driver in FIG. 7 to the low frequency power supply ripple of FIG. 4. Reduced sensitivity to high frequency noise on the supply rail 112 is supplied by the hysteresis of the Schmidt Trigger 107, providing excellent overall immunity to power supply noise and ripple.

The short circuit protection supplied by sense resistors 103 and 109, provides current limiting, particularly for short-term conditions such as occurs during an inter-electrode arc in the case of a plasma or CNT display panel. The remote-side (high voltage) half of the driver might normally be destroyed by a short circuit or an arc.

To offer additional protection, the R-C combination 111/112 integrates the current sense signal in the source of power transistor 108, and is forwarded to transistor 110 to shut off the Schmidt Trigger 107 output, overriding the signal received via capacitor 106.

Additionally, the resistor pair 116/117 provides 'paranoia protection' for arc-induced transients fed back into the circuit via the output line 105.

The back-diode built into the upper power transistor 102 provides for protection for back-flow in that part, while resistor 103 provides its current limiting.

An equivalent circuit for positive-polarity output pulses is illustrated in FIG. 1 where devices 1–18 operate similarly as devices 101–118 of FIG. 7.

This invention restores the use of low-cost capacitive coupling, especially for use in the example display applications, but without the limitations inherent to capacitive coupling. Use of the invention is not limited to display products, but finds wide application for use as a high voltage pulse and line drive circuit in industry, R&D, and the nuclear fields.

Applications of Invention: The present invention can be used in any application where low voltage logic-level pulses must be transmitted across a high-voltage span. While not limited to this application, an example application is for row and column drivers in a plasma or Field Emitting Device (FED) display. For such a display, as illustrated in FIG. 8, low voltage signals in the 3- to 12-Volt range must be sent across a 150-Volt gap.

Figure 8:
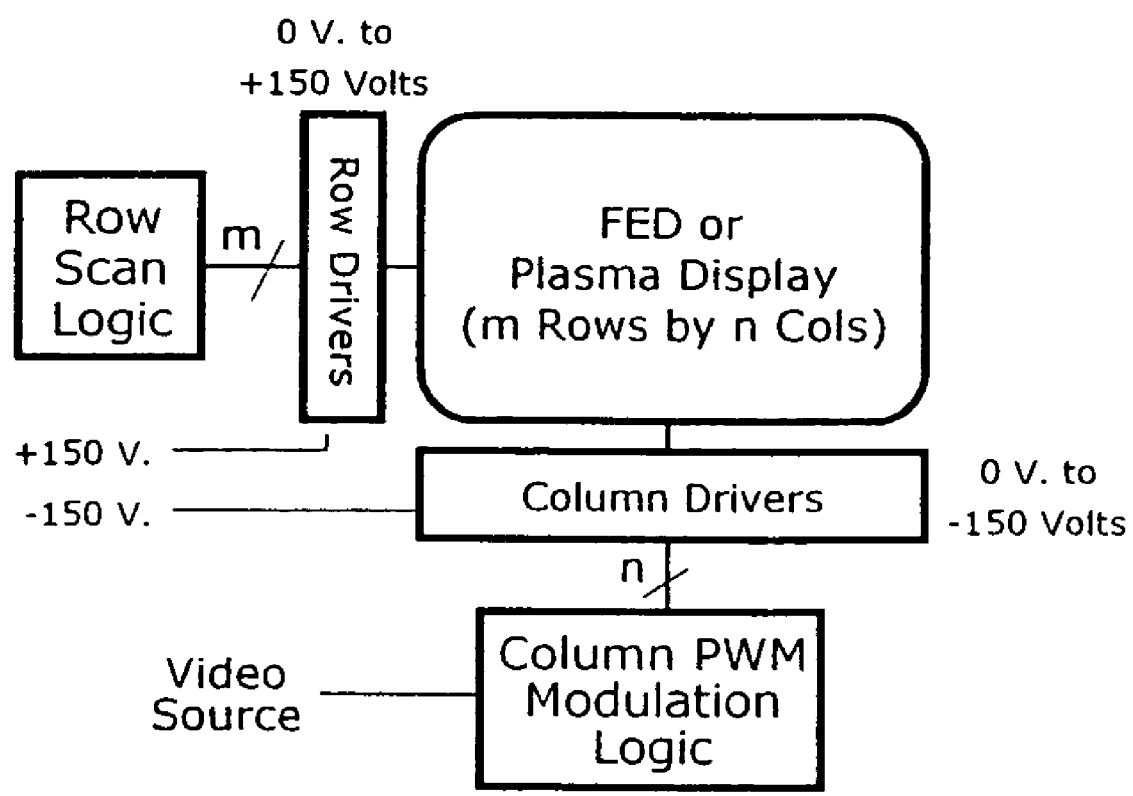
FIG. 8 illustrates a display configured in accordance with the embodiments of the present invention.

In FIG. 8, there is one row driver for each row of pixels in the display, and one column driver for each column in the display. For example, in a 1024×768 pixel display, there are 768 row drivers and 1024 column drivers. The displayed pixels are sequentially displayed a row at a time, with only one row of pixels turned on at any given instant. By rapidly sequencing through the rows, the appearance is given of a continuous display.

When each row driver turns on, in turn, all column drivers are independently supplied with a pulse width proportional to the desired brightness of the current row-selected pixel in that column. Low voltage Pulse Width Modulation (PWM) signals are generated independently for each column driver and are amplified (in saturated fashion) to a 150-Volt pulse, for example, by the means of the present invention.

Of course, an alternative configuration is also possible in which the columns are scanned and the pulse width modulation is applied to the row drivers, instead, without altering the means and intent of this invention.

Many other applications also exist for this invention, such as for high voltage drivers up to the kilo-Volt range. Such pulse drivers find use in R&D laboratories, industry and science. In each case, the traditional high voltage pulse isolation transformer or optical device is replaced with an inexpensive capacitor to span the high voltage rail gap.

Although the present invention and its advantages have been described in detail, it should be understood that various changes, substitutions and alterations can be made herein without departing from the spirit and scope of the invention as defined by the appended claims.

What is claimed is:

1. A driver comprising:
   an amplifier receiving an input signal having a first voltage swing and outputting an amplified signal having a second voltage signal;
   an output;
   a first switch coupled between the amplifier and the output, the first switch controlled by the amplified signal;
   a Schmidt trigger receiving the amplified signal and outputting a third voltage signal;
   a second switch coupled between the Schmidt trigger and the output, the second switch controlled by the third voltage signal;
   a first capacitor and a first resistor coupled between an output of the amplifier and an input of the Schmidt trigger; and
   a second resistor coupled between the input of the Schmidt trigger and an output of the Schmidt trigger.

2. The driver as recited in claim 1, further comprising:
   a third switch and a second resistor coupled between an input of the Schmidt trigger and an output of the Schmidt trigger; and
   a second capacitor coupled to a connection between the third switch and the second resistor.

3. The driver as recited in claim 1, wherein the first switch turns on and the second switch turns off in response to a pulse on the input signal.

4. The driver as recited in claim 1, wherein the input signal is a low voltage CMOS signal, while an output signal of the output has a corresponding signal with a higher voltage signal than the input signal.

5. The driver as recited in claim 1, wherein the input signal is a low voltage CMOS signal, and an output signal of the amplifier has a first voltage signal swing greater than a voltage swing of the input signal, wherein the first switch is a first transistor having its gate electrode receiving the output signal of the amplifier, the first transistor having its first electrode coupled to a power supply and its second electrode coupled to the output, the second switch being a second transistor having its gate electrode receiving an output of the Schmidt trigger, the second transistor having its first electrode coupled to the output and its second electrode coupled to the power supply.

6. The driver as recited in claim 5, further comprising:
   a third transistor coupled between the input of the Schmidt trigger and the power supply; and
   a second capacitor coupled between a gate electrode of the third transistor and the power supply.

7. A driver circuit comprising:
   a CMOS input;
   an amplifier having its input connected to the CMOS input, the amplifier having a first output voltage swing greater than a voltage swing of the CMOS input;
   a Schmidt trigger;
   a high voltage output;
   a first capacitor and a first resistor connected in series between an output of the amplifier and an input of the Schmidt trigger;
   a first transistor having its gate electrode connected to the output of the amplifier;
   a second resistor connected between a first electrode of the first transistor and a voltage potential;
   a third resistor connected between a second electrode of the first transistor and the high voltage output;
   a second transistor having its gate electrode connected to an output of the Schmidt trigger;
   a fourth resistor connected between the input and the output of the Schmidt trigger;
   a fifth resistor connected between a first electrode of the second transistor and the high voltage output;
   a sixth resistor connected between a second electrode of the second transistor and a voltage potential;

a third transistor having a first electrode connected to the input of the Schmidt trigger, and a second electrode connected to a voltage potential;

a second capacitor connected between a gate electrode of the third transistor and a voltage potential; and a seventh resistor connected between the gate electrode of the third transistor and the second electrode of the second transistor.

8. A display comprising:

a screen having a plurality of pixels driven in a matrix-addressable manner; and row and column drivers, wherein a column driver further comprises:

an amplifier receiving an input signal having a first voltage swing and outputting an amplified signal having a second voltage signal;

an output;

a first switch coupled between the amplifier and the output, the first switch controlled by the amplified signal;

a Schmidt trigger receiving the amplified signal and outputting a third voltage signal; and a second switch coupled between the Schmidt trigger and the output, the second switch controlled by the third voltage signal.

9. The display as recited in claim 8, wherein the column driver further comprises:

a first capacitor and a first resistor coupled between an output of the amplifier and an input of the Schmidt trigger; and a second resistor coupled between the input of the Schmidt trigger and an output of the Schmidt trigger.

10. The display as recited in claim 9, further comprising:

a third switch and a first resistor coupled between an input of the Schmidt trigger and an output of the Schmidt trigger; and a first capacitor coupled to a connection between the third switch and the first resistor.

11. The display as recited in claim 8, wherein the first switch turns on and the second switch turns off in response to a pulse on the input signal.

12. The driver as recited in claim 8, wherein the input signal is a low voltage CMOS signal, while an output signal of the output has a corresponding signal with a higher voltage signal than the input signal.

13. The driver as recited in claim 8, wherein the input signal is a low voltage CMOS signal, and an output signal of the amplifier has a first voltage signal swing greater than a voltage swing of the input signal, wherein the first switch is a first transistor having its gate electrode receiving the output signal of the amplifier, the first transistor having its first electrode coupled to a power supply and its second electrode coupled to the output, the second switch being a second transistor having its gate electrode receiving an output of the Schmidt trigger, the second transistor having its first electrode coupled to the output and its second electrode coupled to the power supply, the driver further comprising:

a first capacitor and a first resistor coupled between an output of the amplifier and an input of the Schmidt trigger.

14. The driver as recited in claim 13, further comprising:

a second re coupled between the input and output of the Schmidt trigger;

a third transistor coupled between the input of the Schmidt trigger and the power supply; and a second capacitor coupled between a gate electrode of the third transistor and the power supply.

* * * * *